United States Patent
Nagayama et al.

(10) Patent No.: US 11,869,755 B2
(45) Date of Patent: Jan. 9, 2024

(54) CLEANING METHOD AND PROTECTING MEMBER

(71) Applicant: TOKYO ELECTRON LIMITED, Tokyo (JP)

(72) Inventors: Akira Nagayama, Miyagi (JP); Shinya Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/496,097

(22) Filed: Oct. 7, 2021

(65) Prior Publication Data

US 2022/0115218 A1   Apr. 14, 2022

(30) Foreign Application Priority Data

Oct. 9, 2020   (JP) ................................. 2020-171095

(51) Int. Cl.
*H01J 37/32* (2006.01)
*B08B 7/00* (2006.01)

(52) U.S. Cl.
CPC ...... *H01J 37/32862* (2013.01); *B08B 7/0035* (2013.01); *H01J 37/32449* (2013.01); *H01J 2237/335* (2013.01)

(58) Field of Classification Search
CPC ........... H01J 37/32862; H01J 37/32449; H01J 2237/335; B08B 7/0035; H01L 21/67028; H01L 21/68735
See application file for complete search history.

(56) References Cited

U.S. PATENT DOCUMENTS

| | | | | |
|---|---|---|---|---|
| 2014/0318575 A1* | 10/2014 | Parkhe | ............ | H01J 37/32862 279/157 |
| 2017/0040199 A1* | 2/2017 | Tsuji | ................ | H01L 21/68735 |
| 2019/0201945 A1* | 7/2019 | Tokashiki | ......... | H01L 21/67028 |

FOREIGN PATENT DOCUMENTS

| JP | 2002175957 A | * | 6/2002 |
|---|---|---|---|
| JP | 2010-140944 A | | 6/2010 |

OTHER PUBLICATIONS

Machine translation of JP-2002175957-A (Year: 2002).*

* cited by examiner

*Primary Examiner* — Erin F Bergner
(74) *Attorney, Agent, or Firm* — XSENSUS LLP

(57) ABSTRACT

A method for cleaning a substrate processing apparatus includes mounting a substrate on a mounting portion of an electrostatic chuck of the substrate processing apparatus to process the substrate; mounting a protector including a small diameter portion that covers the mounting portion and a large diameter portion that is disposed apart from an edge ring disposed on an outer periphery of the mounting portion and has a diameter larger than that of the small diameter portion, on the mounting portion; and supplying a cleaning gas, thereby removing by-products deposited between the mounting portion and the edge ring.

12 Claims, 3 Drawing Sheets

CLEANING METHOD AND PROTECTING MEMBER

CROSS-REFERENCE TO RELATED APPLICATIONS

This application is based on and claims priority from Japanese Patent Application No. 2020-171095 filed on Oct. 9, 2020 with the Japan Patent Office, the disclosure of which is incorporated herein in its entirety by reference.

TECHNICAL FIELD

The present disclosure relates to a cleaning method and a protecting member.

BACKGROUND

In a substrate processing apparatus, by-products are produced when an etching processing is performed on a substrate. The produced by-products are deposited in the processing container. Therefore, a cleaning method for cleaning the processing container by an etching processing is known.

Japanese Patent Laid-Open Publication No. 2010-140944 discloses a plasma cleaning method in which a cleaning process is performed to remove by-products from each member in a processing container.

SUMMARY

According to an aspect, a method for cleaning a substrate processing apparatus includes: mounting a substrate on a mounting portion of an electrostatic chuck of the substrate processing apparatus to process the substrate; mounting a protecting member including a small diameter portion that covers the mounting portion and a large diameter portion that is disposed apart from an edge ring disposed on an outer periphery of the mounting portion and has a diameter larger than that of the small diameter portion, on the mounting portion; and supplying a cleaning gas, thereby removing by-products deposited between the mounting portion and the edge ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
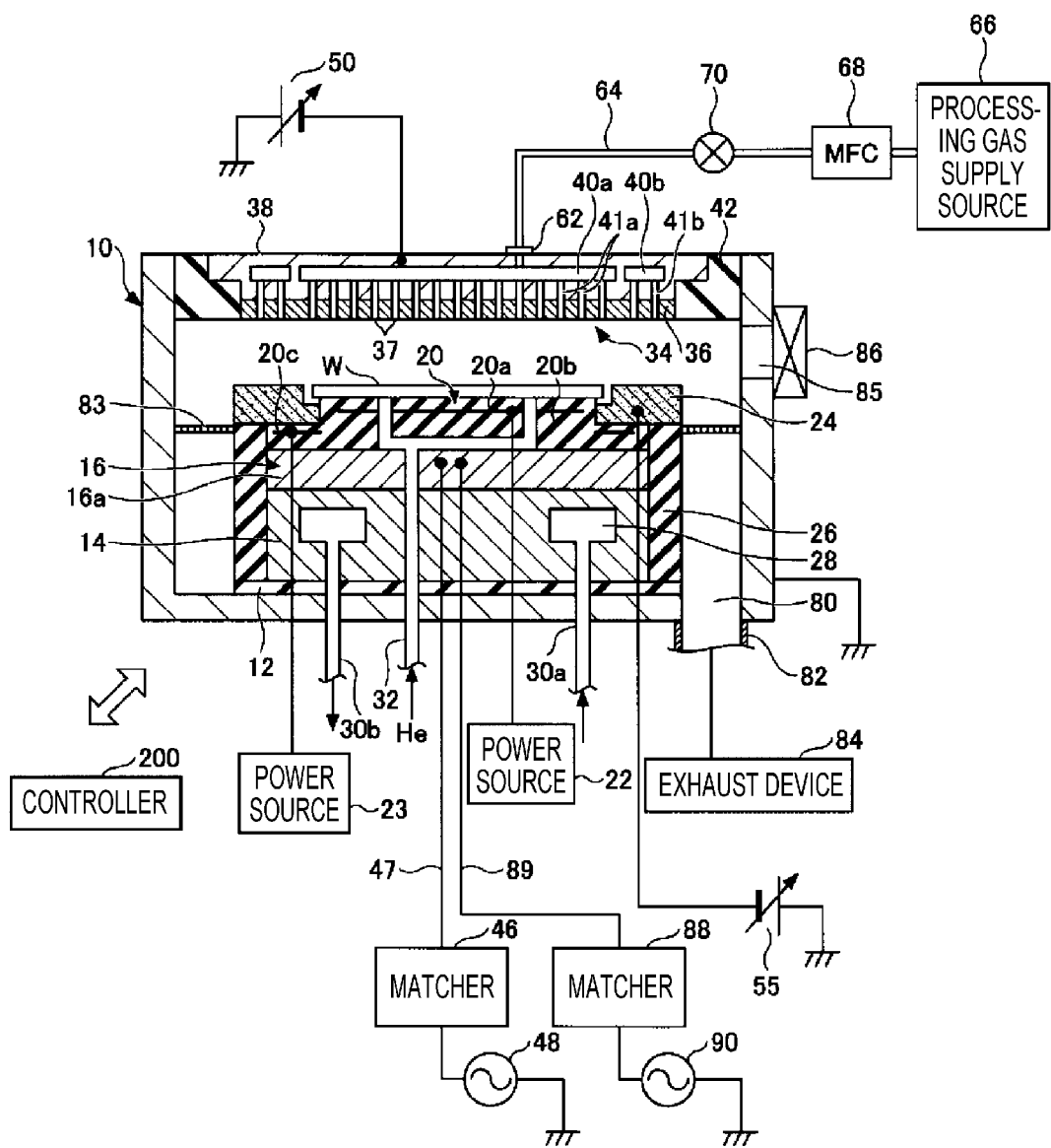
FIG. 1 is a schematic cross-sectional view illustrating an example of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment of the present disclosure will be described with reference to the drawings. In each drawing, the same components may be denoted by the same reference numerals, and duplicate description may be omitted.

[Plasma Processing Apparatus]

A plasma processing apparatus 1 according to an embodiment will be described with reference to FIG. 1. FIG. 1 is a schematic cross-sectional view illustrating an example of the plasma processing apparatus 1 according to the embodiment. The plasma processing apparatus 1 according to the embodiment is a capacitive coupling type parallel plate processing apparatus, and includes a chamber 10. The chamber 10 is, for example, a cylindrical container made of aluminum with an anodized surface, and is grounded.

A columnar support 14 is disposed on a bottom of the chamber 10 via an insulating plate 12 made of, for example, ceramics, and for example, a stage 16 is provided on the support 14. The stage 16 includes an electrostatic chuck 20 and a base 16a, and a wafer W is mounted on an upper surface of the electrostatic chuck 20. An annular edge ring 24 made of, for example, silicon is disposed around the wafer W. The edge ring 24 is also referred to as a focus ring. The edge ring 24 is an example of an outer peripheral member disposed around the stage 16. An annular insulator ring 26 made of, for example, quartz is provided around the base 16a and the support 14. Inside the central side of the electrostatic chuck 20, a first electrode 20a made of a conductive film is embedded in an insulating layer 20b. The first electrode 20a is connected to a power source 22. Due to a voltage applied from the power source 22 to the first electrode 20a, a potential difference is caused between the surface of the electrostatic chuck 20 and the wafer W which is an adsorption target, and thus, the wafer W which is an adsorption target is adsorbed on a wafer mounting surface of the electrostatic chuck 20. Further, inside the outer peripheral side of the electrostatic chuck 20, a second electrode 20c made of a conductive film is embedded in the insulating layer 20b. The second electrode 20c is connected to a power source 23. Due to a voltage applied from the power source 23 to the second electrode 20c, a potential difference is caused between the surface of the electrostatic chuck 20 and the edge ring 24 which is an adsorption target, and thus, the edge ring 24 which is an adsorption target is adsorbed on an edge ring mounting surface of the electrostatic chuck 20. The electrostatic chuck 20 may have a heater to control the temperature.

Inside the support 14, for example, a ring-shaped or a spiral-shaped coolant chamber 28 is formed. A coolant of a predetermined temperature supplied from a chiller unit (not illustrated), for example, cooling water passes through a pipe 30a, the coolant chamber 28, and a pipe 30b, and returns to the chiller unit. The coolant circulates through this path, and thus, the temperature of the wafer W may be controller by the temperature of the coolant. Further, a heat transfer gas supplied from a heat transfer gas supply mechanism (not illustrated), for example, He gas is supplied to a gap between the surface of the electrostatic chuck 20 and the back surface of the wafer W via a gas supply line 32. Due to the heat transfer gas, the heat transfer coefficient between the surface of the electrostatic chuck 20 and the back surface of the wafer W is increased, and thus, the control of the temperature of the wafer W by the temperature of the coolant becomes more effective. Further, when the electrostatic chuck 20 includes a heater, the temperature of the wafer W may be controlled with high responsiveness and high accuracy by the heating with the heater and the cooling with the coolant. Further, the heat transfer gas supplied from the heat transfer gas supply mechanism (not illustrated), for example, He gas may be supplied to a gap between the surface of the electrostatic chuck 20 and the back surface of the edge ring 24 via a gas supply line (not illustrated). Further, by controlling the pressure of the He gas supplied to the gap between the surface of the electrostatic chuck 20 and the back surface of the adsorption target (the wafer W or the edge ring 24), the heat transfer characteristic between the electrostatic chuck 20 and the adsorption target (the wafer W or the edge ring 24) may be controlled, and the temperature of the adsorption target (the wafer W or the edge ring 24) may be controlled.

An upper electrode 34 is provided in a ceiling of the chamber 10 facing the stage 16. A plasma processing space is provided between the upper electrode 34 and the stage 16. The upper electrode 34 closes an opening of the ceiling of the chamber 10 via an insulating shielding member 42. The upper electrode 34 includes an electrode plate 36 and an electrode support 38. The electrode plate 36 has a plurality of gas ejection holes 37 formed in the surface facing the stage 16, and is made of a silicon-containing material such as silicon or SiC. The electrode support 38 detachably supports the electrode plate 36, and is made of a conductive material, for example, aluminum with an anodized surface. Inside the electrode support 38, a plurality of gas flowing holes 41a and 41b extends downward from gas diffusing chambers 40a and 40b, and communicates with the gas ejection holes 37.

A gas introducing port 62 is connected to a processing gas supply source 66 via a gas supply pipe 64. In the gas supply pipe 64, a mass flow controller (MFC) 68 and an opening/closing valve 70 are provided in order from the upstream side where the processing gas supply source 66 is disposed. A processing gas is supplied from the processing gas supply source 66. Then, while controlling the flow rate and the opening/closing by the mass flow controller 63 and the opening/closing valve 70, the processing gas passes through the gas diffusing chambers 40a and 40b and the gas flowing holes 41a and 41b via the gas supply pipe 64 and is ejected in a shower shape from the gas ejection holes 37.

The plasma processing apparatus 1 includes a first radio-frequency power source 90 and a second radio-frequency power source 48. The first radio-frequency power source 90 is a power source that generates a first radio-frequency power (hereinafter, also referred to as an "HF power"). The first radio-frequency power has a frequency suitable for plasma generation. The frequency of the first radio-frequency power is, for example, a frequency within a range of 27 MHz to 100 MHz. The first radio-frequency power source 90 is connected to the base 16a via a matcher 88 and a power supply line 89. The matcher 88 includes a circuit configured to match the output impedance of the first radio-frequency power source 90 and the impedance of the load side (base 16a side). The first radio-frequency power source 90 may be connected to the upper electrode 34 via the matcher 88.

The second radio-frequency power source 48 is a power source that generates a second radio-frequency power (hereinafter, also referred to as an "LF power"). The second radio-frequency power has a frequency lower than the frequency of the first radio-frequency power. When the second radio-frequency power is used together with the first radio-frequency power, the second radio-frequency power is used as a bias radio-frequency power for drawing ions into the wafer W. The frequency of the second radio-frequency power is, for example, a frequency within a range of 400 kHz to 13.56 MHz. The second radio-frequency power source 48 is connected to the base 16a via a matcher 46 and a power supply line 47. The matcher 46 includes a circuit configured to match the output impedance of the second radio-frequency power source 48 and the impedance of the load side (base 16a side). A DC pulse may be used as a bias power for drawing ions into the wafer W. In this case, the plasma processing apparatus 1 includes a DC pulse power source (not illustrated), instead of the second radio-frequency power source 48. The DC pulse power source is connected to the base 16a via the power supply line 47. Further, a synthetic wave obtained by synthesizing a plurality of input voltages such as a DC pulse (rectangular wave) and a triangular wave may be used as the bias power for drawing ions into the wafer W. In this case, the plasma processing apparatus 1 includes a power source (not illustrated) that outputs a synthetic wave, instead of the second radio-frequency power source 48. The power source that generates the synthetic wave is grounded to the base 16a via the power supply line 47.

Plasma may be generated using the second radio-frequency power without using the first radio-frequency power, that is, using a single radio-frequency power. In this case, the frequency of the second radio-frequency power may be a frequency larger than 13.56 MHz, for example, 40 MHz. The plasma processing apparatus 1 may not include the first radio-frequency power source 90 and the matcher 88. With this configuration, the stage 16 also functions as a lower electrode. Further, the upper electrode 34 also functions as a shower heat that supplies a gas.

A second variable power source 50 is connected to the upper electrode 34, and applies a DC voltage to the upper electrode 34. A first variable power source 55 is connected to the edge ring 24, and applies a DC voltage to the edge ring 24. The thickness of a sheath on the edge ring 24 is controlled by applying a predetermined DC voltage corresponding to the amount of consumption of the edge ring 24 from the first variable power source 55 to the edge ring 24. Therefore, the step between the sheath on the edge ring 24 and the sheath on the wafer W is eliminated, and the ion irradiation angle is prevented from being slanted at the edge of the wafer W. Thus, it is possible to avoid the occurrence of tilting in which the cross-sectional shape of the pattern formed on the wafer W becomes slanted.

An exhaust device 84 is connected to an exhaust pipe 82. The exhaust device 84 includes a vacuum pump such as a turbo molecular pump, exhausts from an exhaust port 80 formed at the bottom of the chamber 10 to the exhaust pipe 82, and reduces the pressure inside the chamber 10 to a desired degree of vacuum. Further, the exhaust device 84 constantly controls the pressure in the chamber 10 while using the value of a pressure gauge (not illustrated) that measures the pressure in the chamber 10. A carry-in/out port 85 is formed in the sidewall of the chamber 10. The wafer W is carried into/out from the carry-in/out port 85 by opening/closing a gate valve 86.

A baffle plate 83 is provided in an annular shape between the insulator ring 26 and the side wall of the chamber 10. The baffle plate 83 has a plurality of through holes, and is made of aluminum, the surface of which is covered with ceramics such as $Y_2O_3$.

When performing a predetermined plasma processing such as a plasma etching processing in the plasma processing apparatus 1 having such configuration, the gate valve 86 is opened, the wafer W is carried into the chamber 10 through the carry-in/out port 85 and is mounted on the wafer mounting surface of the electrostatic chuck 20, and the gate valve 86 is closed. Further, the edge ring 24 is mounted on the edge ring mounting surface of the electrostatic chuck 20. A processing gas is supplied into the chamber 10, and the inside of the chamber 10 is exhausted by the exhaust device 84.

The first radio-frequency power and the second radio-frequency power are applied to the stage 16. Then, the power source 22 applies a voltage to the first electrode 20a in the electrostatic chuck 20 to adsorb the wafer W onto the wafer mounting surface of the electrostatic chuck 20. Further, the power source 23 applies a voltage to the second electrode 20c in the electrostatic chuck 20 to adsorb the edge ring 24 onto the edge ring mounting surface of the electrostatic chuck 20.

A plasma processing such as etching is performed on the processing target surface of the wafer W by radicals or ions in the plasma generated in the plasma processing space.

The plasma processing apparatus 1 is provided with a controller 200 that controls the operation of the entire apparatus. The CPU provided in the controller 200 executes a desired plasma processing such as etching according to a recipe stored in a memory such as a ROM and a RAM. In the recipe, process time, pressure (exhaust of gas), first and second radio-frequency power or voltages, various gas flow rates, which are control information of the apparatus for process conditions, may be set. Further, in the recipe, for example, the temperature in the chamber (e.g., upper electrode temperature, temperature of the side wall of the chamber, wafer W temperature, electrostatic chuck temperature), and the temperature of the coolant output from a chiller may be set. The recipe indicating such programs or process conditions may be stored in a hard disk or a semiconductor memory. Further, the recipe may be set at a predetermined position and read out in a state of being stored in a storage medium readable by a portable computer such as a CD-ROM or a DVD.

Next, an example of the operation of the plasma processing apparatus 1 will be described.

First, the plasma processing apparatus 1 performs an etching processing step in which an etching processing is performed on the wafer W. Here, the wafer W is mounted on the stage 16, and is adsorbed by the electrostatic chuck 20. The pressure in the chamber 10 is reduced to a vacuum atmosphere by the exhaust device 84. An etching gas is supplied from the processing gas supply source 66 into the chamber 10. Further, the first radio-frequency power source 90 and the second radio-frequency power source 48 apply radio-frequency power to the base 16a to generate plasma. As a result, an etching processing is performed on the wafer W.

Figure 2:
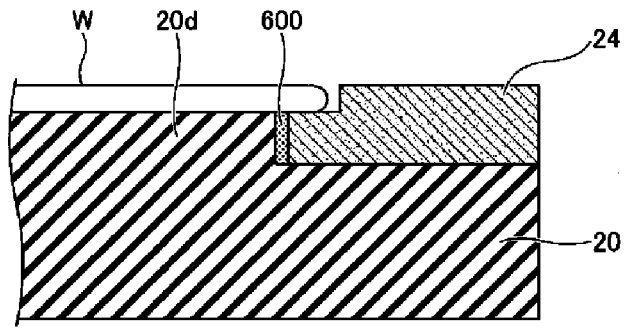
FIG. 2 is an example of a partially enlarged cross-sectional view of an upper portion of a stage of the plasma processing apparatus after performing an etching processing on a substrate.

FIG. 2 is an example of a partially enlarged cross-sectional view of an upper portion of a stage of the plasma processing apparatus 1 after performing an etching processing on the wafer W.

A substrate mounting portion 20d is formed in the central portion of the electrostatic chuck 20 to protrude from the outer periphery. The annular edge ring 24 is disposed on the outer periphery of the electrostatic chuck 20. The wafer W is mounted and adsorbed onto the substrate mounting portion 20d. In the plasma processing apparatus 1, by-products are generated by performing an etching processing on the wafer W. The generated by-products are deposited as a by-product 600 between the side wall of the substrate mounting portion 20d and the inner side wall of the edge ring 24.

The by-product 600 is deposited between the side wall of the substrate mounting portion 20d and the inner side wall of the edge ring 24, and it may affect, for example, the flow of a heat transfer gas (He gas). As a result, the characteristics of the etching processing of the wafer W may be changed.

Figure 3:
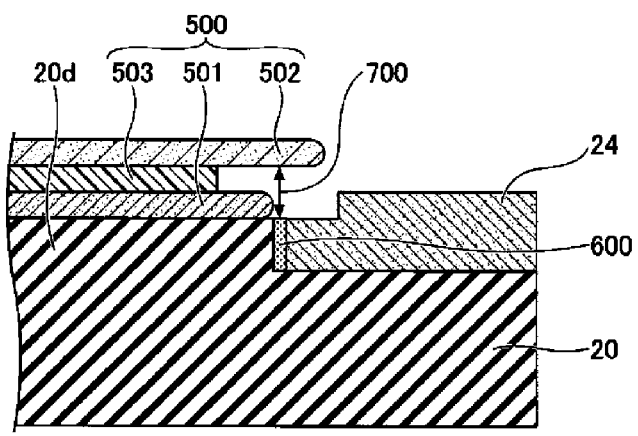
FIG. 3 is an example of a partially enlarged cross-sectional view of the upper portion of the stage of the plasma processing apparatus when performing cleaning.

The plasma processing apparatus 1 cleans the by-products deposited in the chamber 10. FIG. 3 is an example of a partially enlarged cross-sectional view of the upper portion of the stage of the plasma processing apparatus 1 when performing cleaning.

First, a protecting member 500 is mounted on the substrate mounting portion 20d, and is adsorbed by the electrostatic chuck 20. Here, the protecting member 500 includes a small diameter portion 501, a large diameter portion 502, and an intermediate portion 503.

The small diameter portion 501 is a member that is in contact with the substrate mounting portion 20d and covers the upper surface of the substrate mounting portion 20d when the protecting member 500 is mounted and adsorbed onto the substrate mounting portion 20d. The small diameter portion 501 is formed in a disc shape having a diameter equal to or slightly smaller than that of the substrate mounting portion 20d. Further, the small diameter portion 501 is formed to have a diameter smaller than that of the large diameter portion 502. Further, the small diameter portion 501 is formed to have a diameter smaller than that of the wafer W (see FIG. 2).

When the protecting member 500 is mounted and adsorbed onto the substrate mounting portion 20d, the small diameter portion 501 covers the upper surface of the substrate mounting portion 20d. Meanwhile, the small diameter portion 501 is not able to block the space above the gap between the side wall of the substrate mounting portion 20d and the inner side wall of the edge ring 24 in which the by-product 600 is deposited.

The large diameter portion 502 is a member that is disposed apart from the upper surface of the substrate mounting portion 20d when the protecting member 500 is mounted and adsorbed onto the substrate mounting portion 20d. The large diameter portion 502 is formed in a disc shape having a diameter larger than that of the small diameter portion 501. Further, the large diameter portion 502 is formed to have a diameter larger than that of the substrate mounting portion 20d. Further, the large diameter portion 502 is formed to have a diameter equal to that of the wafer W (see FIG. 2).

When the protecting member 500 is mounted and adsorbed onto the substrate mounting portion 20d, the large diameter portion 502 is disposed above the gap between the side wall of the substrate mounting portion 20d and the inner side wall of the edge ring 24 in which the by-product 600 is deposited. As a result, the large diameter portion 502 and the edge ring 24 have a facing structure 700 that faces each other while maintaining a constant distance.

The intermediate portion 503 is provided between the small diameter portion 501 and the large diameter portion 502 to connect the small diameter portion 501 and the large diameter portion 502. The intermediate portion 503 is formed in a disc shape having a diameter smaller than that of the small diameter portion 501.

The protecting member 500 may be produced by processing three discs (small diameter portion 501, intermediate portion 503, and large diameter portion 502) having different diameters, respectively, and bonding them. As a result, the protecting member 500 may be easily processed and produced.

Figure 4:
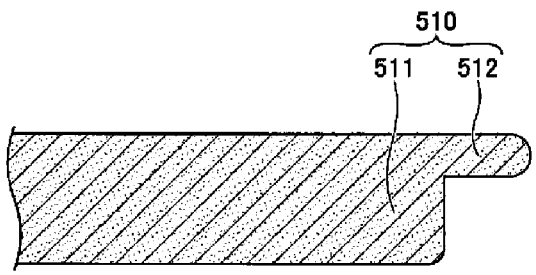
FIG. 4 is an example of a cross-sectional view illustrating a shape of another protecting member.

The shape of the protecting member 500 is not limited to the shape illustrated in FIG. 3. FIG. 4 is an example of a cross-sectional view illustrating a shape of another protecting member 510. The protecting member 510 illustrated in FIG. 4 has a small diameter portion 511 and a large diameter portion 512. The small diameter portion 511 is a member that covers the upper surface of the substrate mounting portion 20D, and is formed in a disc shape having a diameter equal to or slightly smaller than that of the substrate mounting portion 20d. The large diameter portion 512 is a member that is disposed apart from the upper surface of the substrate mounting portion 20d, and is formed in a disc shape having a diameter larger than that of the small diameter portion 511. Further, the large diameter portion 512 is formed to have a diameter larger than that of the substrate mounting portion 20d. The protecting member 510 may be produced by bonding the small diameter portion 511 and the large diameter portion 512. Further, in the protecting member 510, the small diameter portion 511 and the large diameter portion 512 may be integrally formed.

Figure 5:
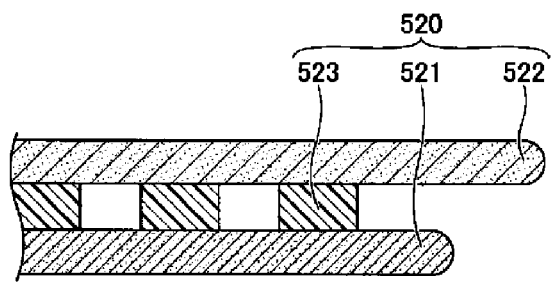
FIG. 5 is an example of a cross-sectional view illustrating a shape of yet another protecting member.

FIG. 5 is an example of a cross-sectional view illustrating a shape of yet another protecting member 520. The protecting member 520 illustrated in FIG. 5 includes a small diameter portion 521, a large diameter portion 522, and an intermediate portion 523. The small diameter portion 521 is a member that covers the upper surface of the substrate mounting portion 20D, and is formed in a disc shape having a diameter equal to or slightly smaller than that of the substrate mounting portion 20d. The large diameter portion 522 is a member that is disposed apart from the upper surface of the substrate mounting portion 20d, and is formed in a disc shape having a diameter larger than that of the small diameter portion 521. Further, the large diameter portion 522 is formed to have a diameter larger than that of the substrate mounting portion 20d. The intermediate portion 523 is provided between the small diameter portion 521 and the large diameter portion 522 to connect the small diameter portion 521 and the large diameter portion 522. The intermediate portion 523 includes a plurality of pillar members. The warp of the small diameter portion 521 and the large diameter portion 522 may be suppressed by connecting the small diameter portion 521 and the large diameter portion 522 with the plurality of pillar members.

Further, the protecting members 500, 510, and 520 (small diameter portions 501, 511, and 521, large diameter portions 502, 512, and 513, and intermediate portions 503 and 523) are made of a material that does not soil the inside of the chamber 10 when etched by the plasma of the cleaning gas. For example, the protecting members 500, 510, and 520 may be made of silicon. Further, the protecting members 500, 510, and 520 may be made of at least one of silicon, silicon carbide, alumina, and sapphire.

Next, cleaning inside the chamber 10 is performed. Here, the pressure in the chamber 10 is reduced to a vacuum atmosphere by the exhaust device 84. A cleaning gas is supplied from the processing gas supply source 66 into the chamber 10. Further, the first radio-frequency power source 90 and the second radio-frequency power source 48 apply radio-frequency power to the base 16a to generate plasma. As a result, the by-product 600 deposited in the chamber 10 is removed (ashed).

The small diameter portion 501 of the protecting member 500 covers the upper surface of the substrate mounting portion 20d. As a result, in the dry cleaning using plasma, it is possible to suppress the upper surface (adsorption surface) of the substrate mounting portion 20d from being deteriorated by the plasma of the cleaning gas.

Further, the edge ring 24 and the large diameter portion 502 have a facing structure 700 that faces each other while maintaining a constant distance. With the facing structure 700, plasma is generated in the space between the edge ring 24 and the large diameter portion 502. As a result, the density of the plasma increases, and the removal rate of the by-product 600 during the cleaning is improved.

Here, a cleaning method according to a reference example will be described with reference to FIGS. 6 and 7.

Figure 6:
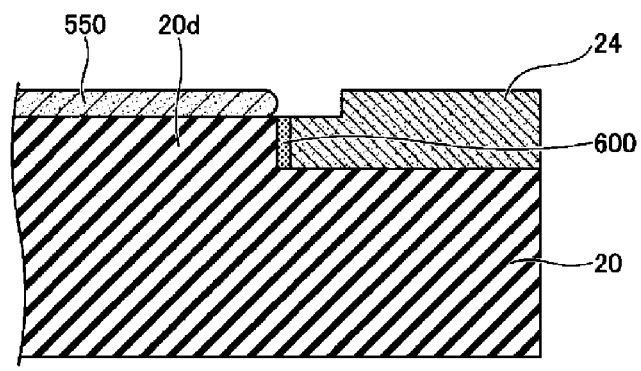
FIG. 6 is a partially enlarged cross-sectional view of an upper portion of a stage of a plasma processing apparatus when performing cleaning in Reference Example 1.

FIG. 6 is a partially enlarged cross-sectional view of an upper portion of a stage of a plasma processing apparatus when performing cleaning in Reference Example 1. A protecting member 550 is formed in a disc shape having a diameter equal to that of the substrate mounting portion 20d. Further, during the cleaning, the protecting member 500 is mounted on the substrate mounting portion 20d. As a result, the upper surface (adsorption surface) of the substrate mounting portion 20d may be protected. Meanwhile, the removal rate of the by-product 600 deposited between the side wall of the substrate mounting portion 20d and the inner side wall of the edge ring 24 may not be improved.

Figure 7:
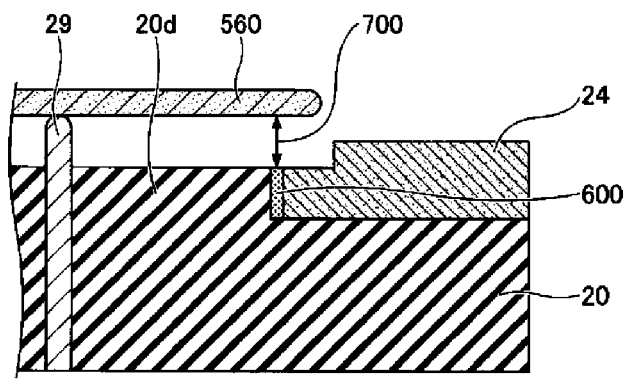
FIG. 7 is a partially enlarged cross-sectional view of an upper portion of a stage of a plasma processing apparatus when performing cleaning in Reference Example 2.

FIG. 7 is a partially enlarged cross-sectional view of an upper portion of a stage of a plasma processing apparatus when performing cleaning in Reference Example 2. A protecting member 560 is formed in a disc shape having a diameter larger than that of the substrate mounting portion 20d. Further, during the cleaning, the protecting member 560 is lifted by a support pin 29 of the stage 16, and is apart from the substrate mounting portion 20d and the edge ring 24 to form a facing structure 700. As a result, the removal rate of the by-product 600 deposited between the side wall of the substrate mounting portion 20d and the inner side wall of the edge ring 24 may be improved. Meanwhile, the upper surface (adsorption surface) of the substrate mounting portion 20d is eroded by the plasma of the etching gas.

Meanwhile, as illustrated in FIG. 3, according to the cleaning method using the protecting member 500, it is possible to effectively remove the by-product 600 deposited between the side wall of the substrate mounting portion 20d and the inner side wall of the edge ring 24 while protecting the upper surface (adsorption surface) of the substrate mounting portion 20d.

According to an aspect, it is possible to provide the cleaning method in which the by-product deposited around the mounting portion on which the substrate is mounted is removed, and the protecting member.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A method for cleaning a substrate processing apparatus, the method comprising:
  mounting a protector including a small diameter portion that covers a mounting portion of an electrostatic chuck on which a substrate is mountable, a large diameter portion that is disposed apart from an edge ring disposed on an outer periphery of the mounting portion and has a diameter larger than that of the small diameter portion, and an intermediate portion that is disposed on the small diameter portion and between the small diameter portion and the large diameter portion connecting the small diameter portion and the large diameter portion, on the mounting portion; and
  supplying a cleaning gas, thereby removing by-products deposited between the mounting portion and the edge ring,
  wherein the large diameter portion is disposed on the intermediate portion,
  the small diameter portion has a diameter equal to or smaller than that of an upper surface of the mounting portion,
  the intermediate portion has a diameter equal to or smaller than that of the small diameter portion and smaller than that of the large diameter portion, and
  a bottom surface of the large diameter portion above a gap between the mounting portion and the edge ring is disposed higher than the upper surface of the mounting portion.

2. The method according to claim 1, wherein the supplying the cleaning gas includes generating plasma of the cleaning gas.

3. The method according to claim 2, wherein the large diameter portion has a diameter larger than that of the mounting portion.

4. The method according to claim 3, wherein the protector is made of at least one of silicon, silicon carbide, alumina, and sapphire.

5. The method according to claim 1, wherein the large diameter portion has a diameter larger than that of the mounting portion.

6. The method according to claim 1, wherein the protector is made of at least one of silicon, silicon carbide, alumina, and sapphire.

7. A substrate processing apparatus comprising a protecting member and a cleaning gas supply, the protecting member comprising:
  a small diameter portion mounted on a mounting portion of an electrostatic chuck provided in the substrate processing apparatus, when cleaning the substrate processing apparatus, the small diameter portion being configured to cover the mounting portion;
  a large diameter portion disposed apart from an edge ring on an outer periphery of the mounting portion and having a diameter larger than that of the small diameter portion; and
  an intermediate portion disposed on the small diameter portion and between the small diameter portion and the large diameter portion connecting the small diameter portion and the large diameter portion,
  wherein the large diameter portion is disposed on the intermediate portion,
  the small diameter portion has a diameter equal to or smaller than that of an upper surface of the mounting portion,
  the intermediate portion has a diameter equal to or smaller than that of the small diameter portion and smaller than that of the large diameter portion, and
  a bottom surface of the large diameter portion above a gap between the mounting portion and the edge ring is disposed higher than the upper surface of the mounting portion.

8. The method according to claim 1, wherein the bottom surface of the large diameter portion above the gap between the mounting portion and the edge ring is disposed apart from the upper surface of the mounting portion by a distance substantially equal to or larger than a thickness of the small diameter portion.

9. The method according to claim 1, wherein the gap is between a side wall of the mounting portion and an inner side wall of the edge ring.

10. The method according to claim 1, wherein the bottom surface of the large diameter portion above the gap between the mounting portion and the edge ring is disposed higher than the upper surface of the mounting portion, thereby allowing the gap not to be covered by the small diameter portion and the large diameter portion.

11. The method according to claim 1, wherein the small diameter portion, the intermediate portion, and the large diameter portion are integrally formed.

12. The method according to claim 1, wherein the intermediate portion includes a plurality of pillar members.

* * * * *